(12) United States Patent
Hildesheim et al.

(10) Patent No.: US 11,430,687 B2
(45) Date of Patent: Aug. 30, 2022

(54) VACUUM HOLD-DOWN APPARATUS FOR FLATTENING BOWED SEMICONDUCTOR WAFERS

(71) Applicant: KLA-TENCOR CORPORATION, Milpitas, CA (US)

(72) Inventors: Ariel Hildesheim, Kiryat Tiveon (IL); Ofer Angel, Ramat David (IL)

(73) Assignee: KLA-TENCOR CORPORATION, Milpitas, CA (US)

( * ) Notice: Subject to any disclaimer, the term of this patent is extended or adjusted under 35 U.S.C. 154(b) by 530 days.

(21) Appl. No.: 16/340,634

(22) PCT Filed: Mar. 25, 2019

(86) PCT No.: PCT/US2019/023918
§ 371 (c)(1),
(2) Date: Apr. 9, 2019

(87) PCT Pub. No.: WO2020/197544
PCT Pub. Date: Oct. 1, 2020

(65) Prior Publication Data
US 2021/0217645 A1 Jul. 15, 2021

(51) Int. Cl.
*B25B 11/00* (2006.01)
*H01L 21/683* (2006.01)
*H01L 21/687* (2006.01)

(52) U.S. Cl.
CPC ........ *H01L 21/6838* (2013.01); *B25B 11/005* (2013.01); *H01L 21/68764* (2013.01)

(58) Field of Classification Search
CPC ... B25B 11/00; B25B 11/005; H01L 21/6831; H01L 21/6833
See application file for complete search history.

(56) References Cited

U.S. PATENT DOCUMENTS

| | | | | |
|---|---|---|---|---|
| 4,896,869 | A * | 1/1990 | Takekoshi | B23Q 1/623 269/60 |
| 6,286,822 | B1 * | 9/2001 | Blick | B24B 9/08 269/21 |
| 7,607,647 | B2 * | 10/2009 | Zhao | B25B 11/005 269/20 |
| 2013/0330154 | A1 | 12/2013 | Sowden et al. | |
| 2014/0184003 | A1 * | 7/2014 | Kiesewetter | G01R 31/2887 310/90 |

FOREIGN PATENT DOCUMENTS

| | | |
|---|---|---|
| JP | 2007189226 A | 7/2007 |
| JP | 2015109416 A | 6/2015 |
| KR | 1020100045607 A | 5/2010 |
| KR | 1020140042337 A | 4/2014 |

OTHER PUBLICATIONS

WIPO, ISR for PCT/US2019/023918, Dec. 19, 2019.

* cited by examiner

*Primary Examiner* — Lee D Wilson
(74) *Attorney, Agent, or Firm* — Hodgson Russ LLP

(57) ABSTRACT

A vacuum hold-down apparatus retains a wafer in a desired position and orientation. A vacuum chuck assembly of the vacuum hold-down apparatus has a vacuum chuck surface with a vacuum communication aperture. A venturi vacuum generator is fixed with respect to the vacuum chuck assembly and communicates with the vacuum chuck surface via the vacuum communication aperture. A positive pressure fluid line communicates with the venturi vacuum generator.

20 Claims, 14 Drawing Sheets

VACUUM HOLD-DOWN APPARATUS FOR FLATTENING BOWED SEMICONDUCTOR WAFERS

FIELD OF THE INVENTION

The present invention relates to vacuum hold-down apparatus and vacuum chucks generally and more particularly to vacuum hold-down apparatus for use in the semiconductor industry.

BACKGROUND OF THE INVENTION

Various types of vacuum chucks are known for use in the semiconductor industry.

SUMMARY OF THE INVENTION

The present invention seeks to provide improved vacuum hold-down apparatus which is particularly suitable for use in the semiconductor industry but is not limited to use in that industry.

There is thus provided in accordance with a preferred embodiment of the present invention vacuum hold-down apparatus suitable for retaining a wafer in a desired position and orientation, the apparatus including a vacuum chuck assembly defining a vacuum chuck surface having a vacuum communication aperture, a venturi vacuum generator fixed with respect to the vacuum chuck assembly and communicating with the vacuum chuck surface via the vacuum communication aperture and a positive pressure fluid line communicating with the venturi vacuum generator.

In accordance with a preferred embodiment of the present invention the vacuum chuck assembly and the venturi vacuum generator are both mounted on a movable stage.

In accordance with a preferred embodiment of the present invention the positive pressure fluid line is a flexible fluid line.

In accordance with a preferred embodiment of the present invention the vacuum hold-down apparatus also includes a fixed positive pressure fluid source which is coupled via the positive pressure fluid line to the venturi vacuum generator mounted on the movable stage.

Preferably, the vacuum chuck surface is rotatable relative to the vacuum chuck assembly.

In accordance with a preferred embodiment of the present invention the movable stage is an X-Y movable stage.

Preferably, the vacuum chuck assembly includes a vacuum chuck surface defining element which is rotatable relative to the venturi vacuum generator. Additionally, the venturi vacuum generator is coupled to the vacuum chuck surface of the vacuum chuck surface defining element via a central vacuum manifold and conduit assembly having a rotatable vacuum connection to the vacuum chuck surface defining element.

In accordance with a preferred embodiment of the present invention the venturi vacuum generator is coupled to the vacuum chuck surface of the vacuum chuck surface defining element via a plurality of vacuum ports and a plurality of vacuum conduits, which are connected to a plurality of corresponding vacuum input ports of the central vacuum manifold and conduit assembly. Additionally, the central vacuum manifold and conduit assembly includes a manifold, which is connected to the vacuum input ports and includes a single vacuum output conduit portion, which is coupled to the rotatable vacuum connection.

According to a preferred embodiment, the device also includes an additional vacuum connection communicating with the vacuum chuck surface via the vacuum communication aperture.

According to a preferred embodiment, the vacuum hold-down apparatus is operative to selectively supply vacuum to the vacuum chuck assembly from either the venturi vacuum generator or from the additional vacuum connection.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1A:
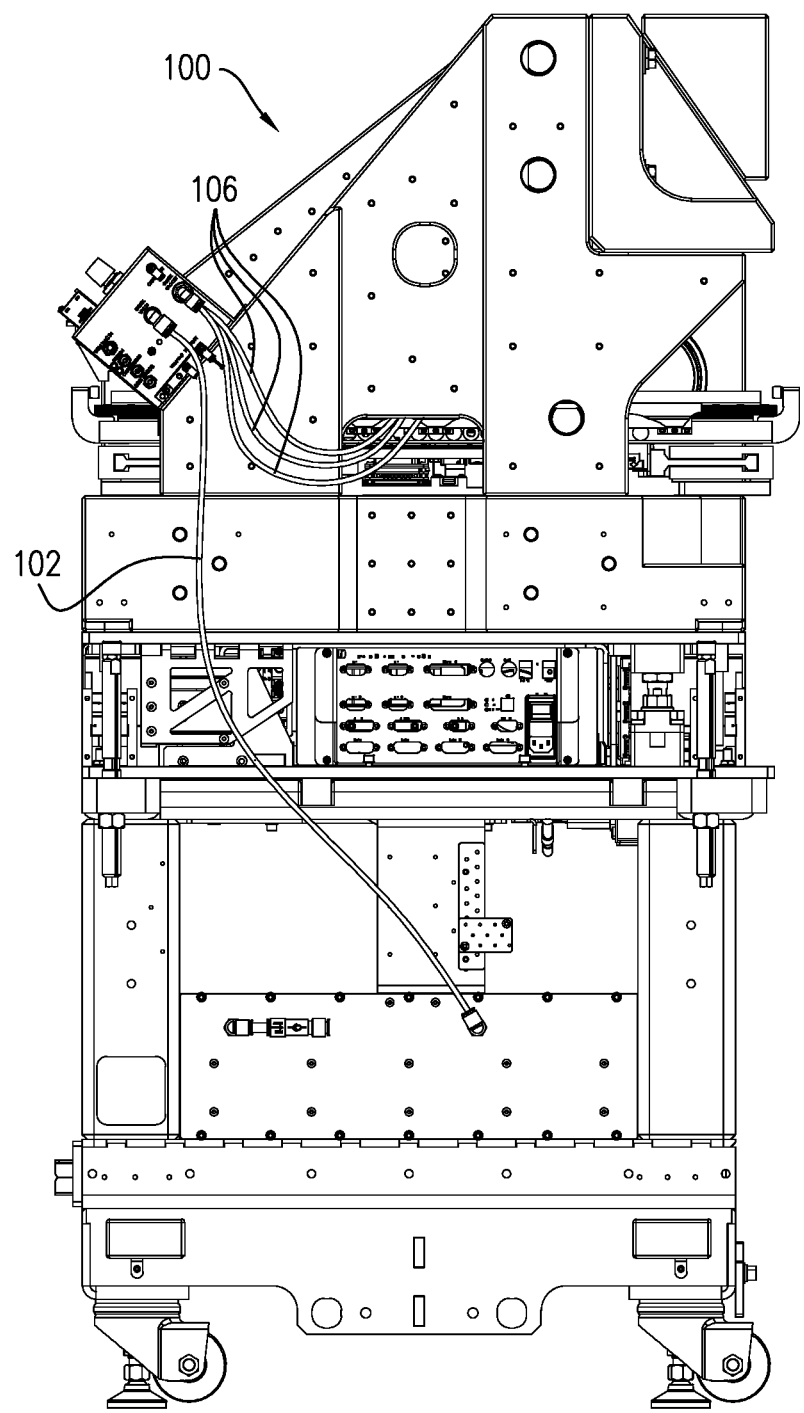
FIGS. 1A, 1B and 1C are simplified pictorial illustrations taken from various perspectives, showing pan of a semiconductor wafer processing machine constructed and operative in accordance with a preferred embodiment of the present invention.
Figure 1B:
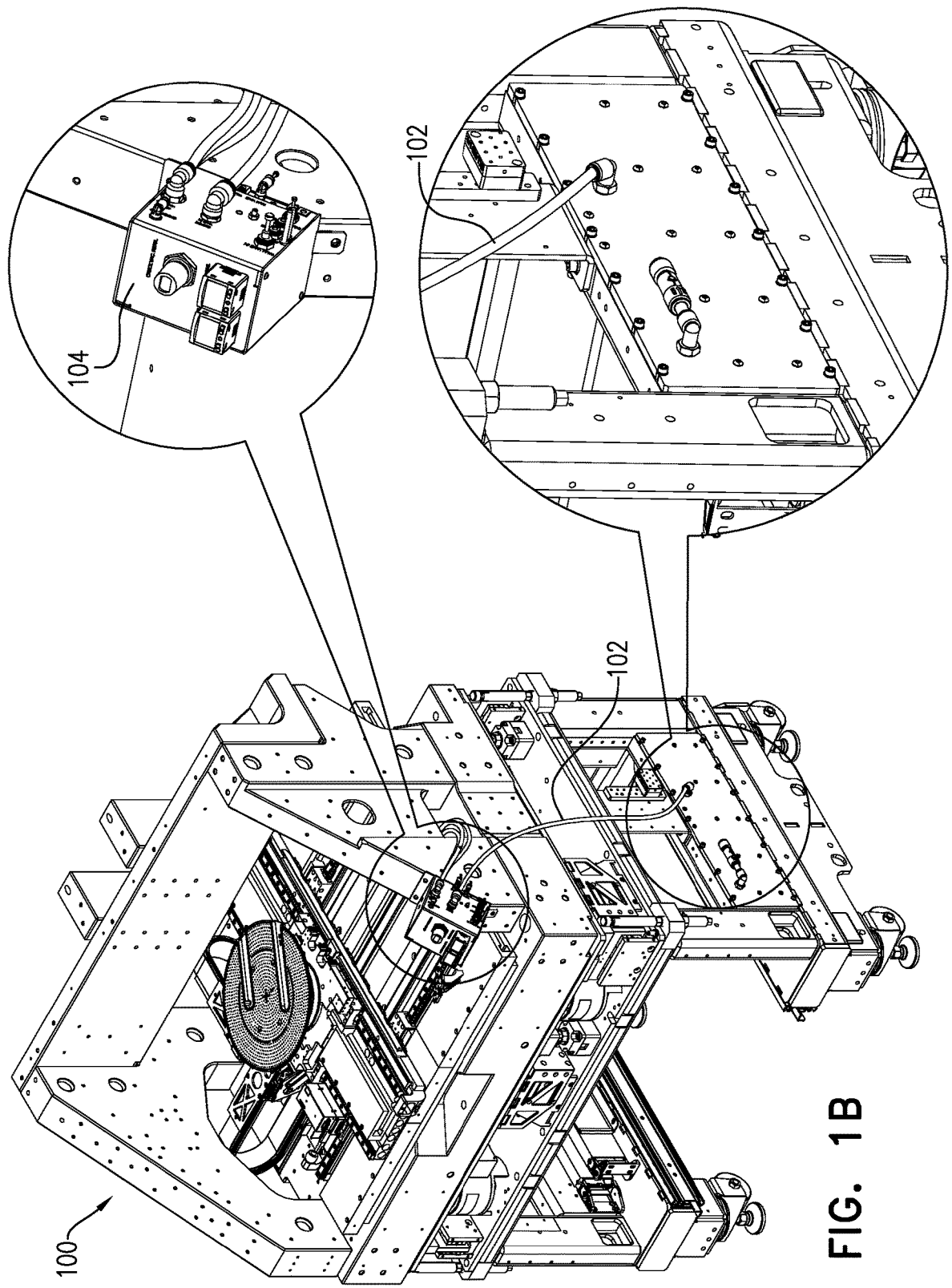
Figure 1C:
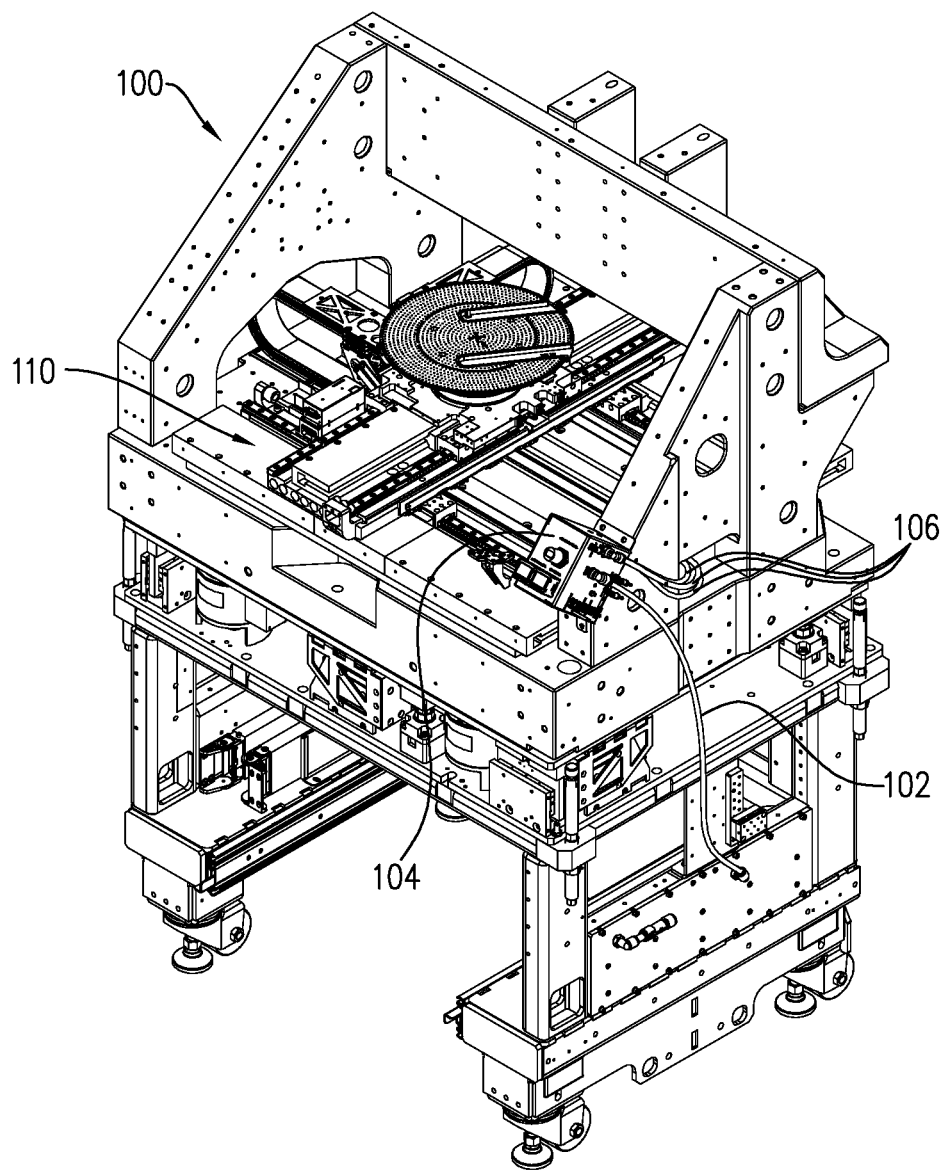
Figure 2A:
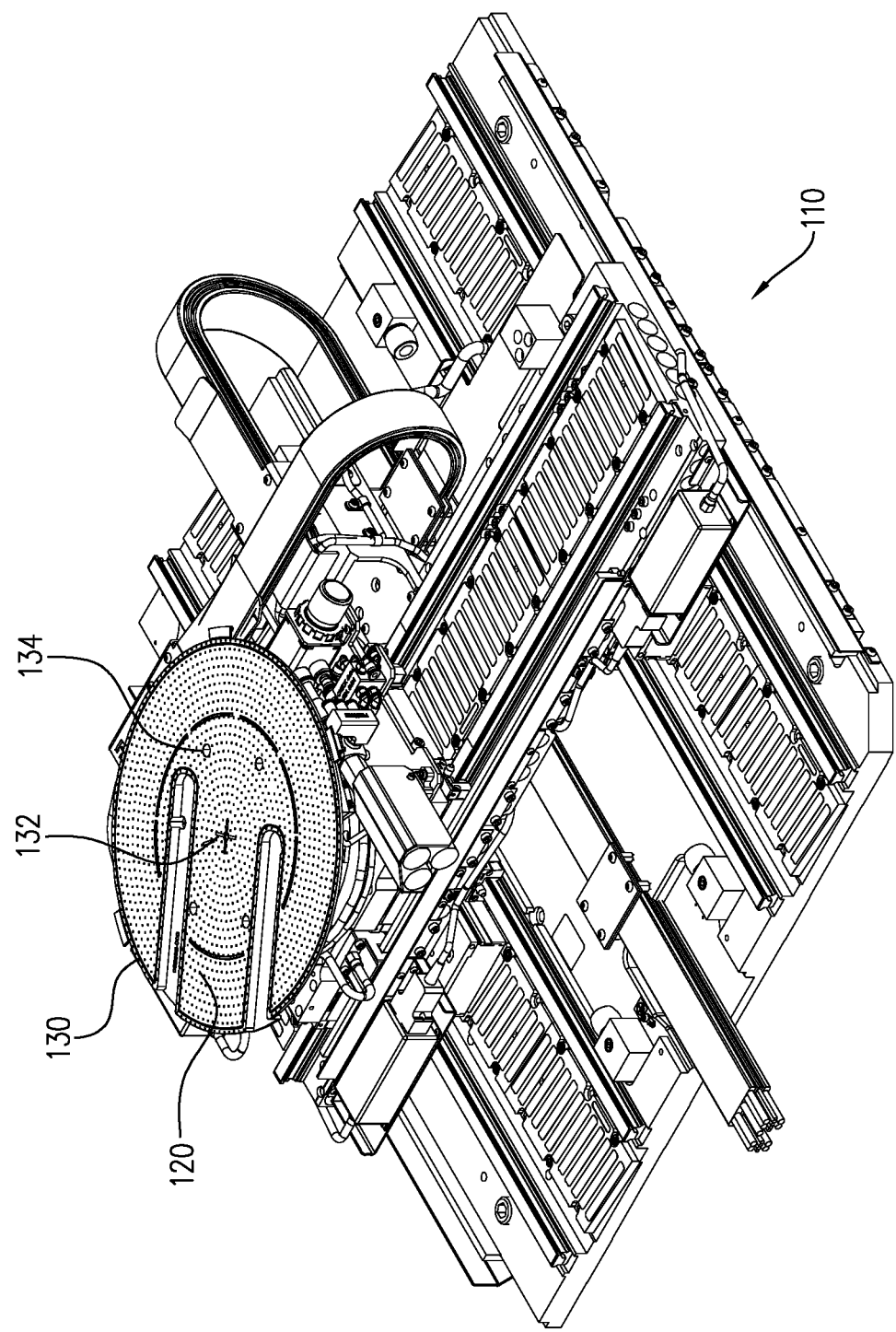
FIGS. 2A. 2B and 2C are simplified pictorial illustrations of a moveable stage assembly forming part of the semiconductor wafer processing machine of FIGS. 1A-1C and showing flexible positive fluid pressure connections to a venturi sub-assembly forming a part thereof.
Figure 2B:
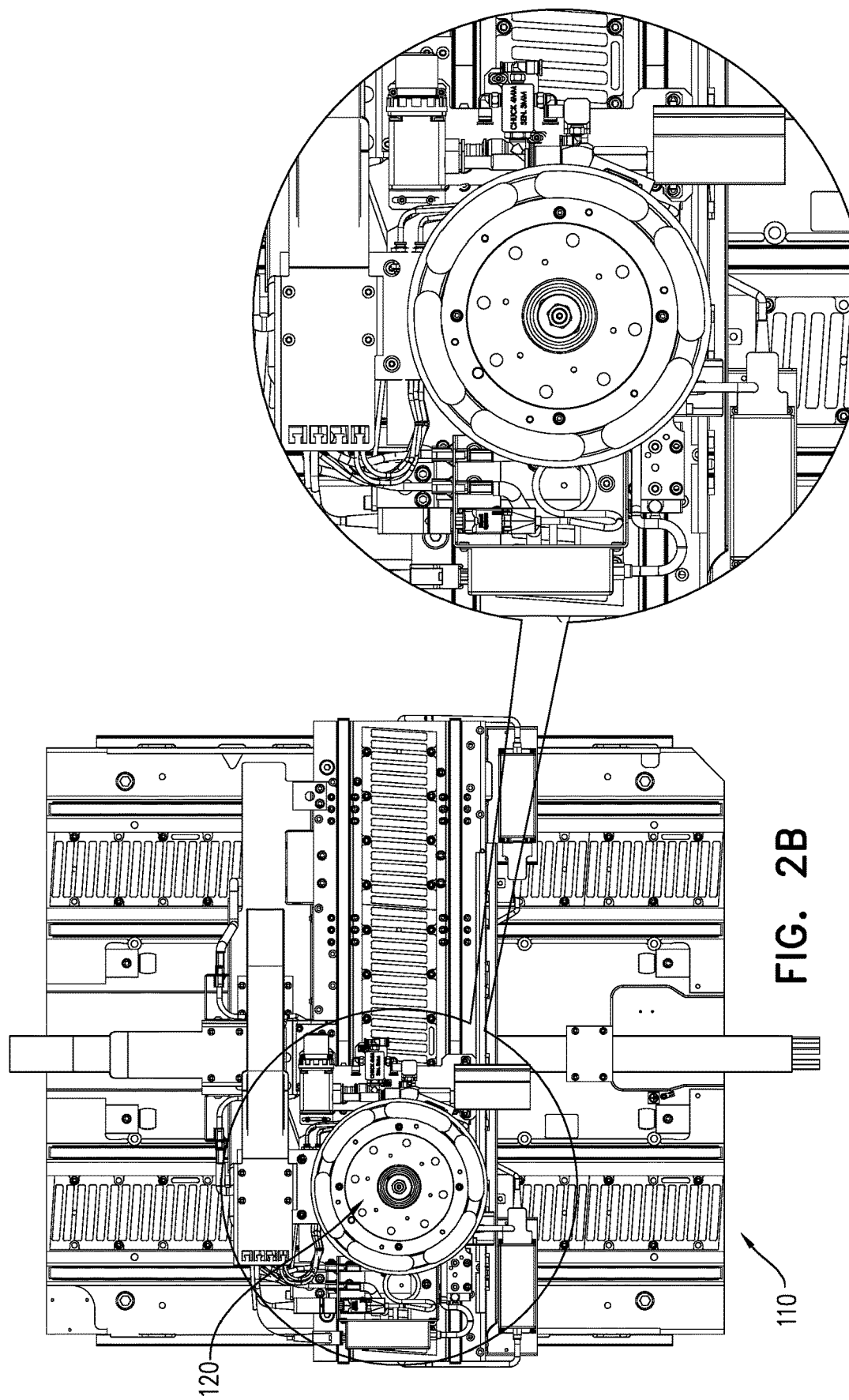
Figure 2C:
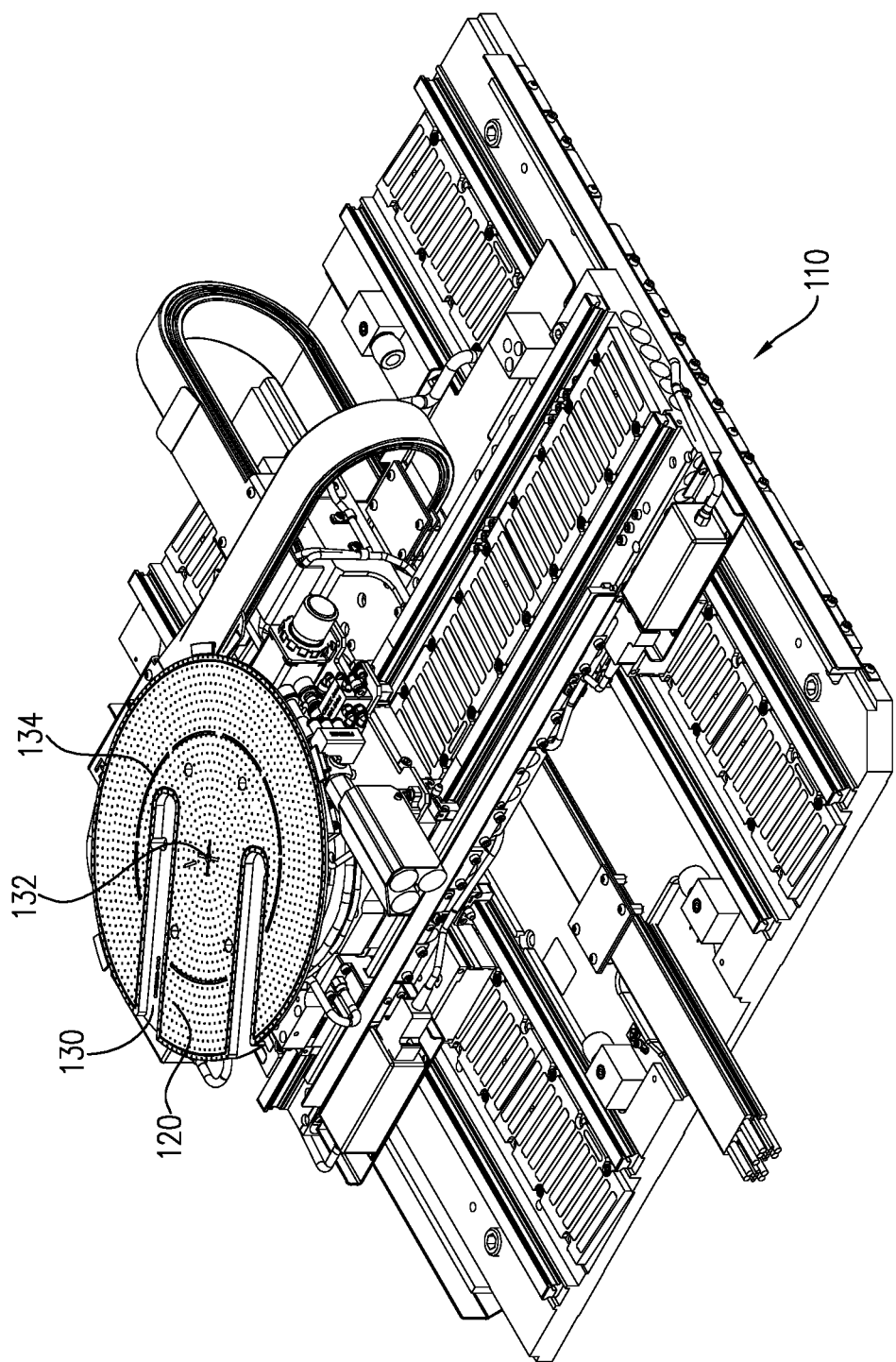

Reference is now made to FIGS. 1A, 1B and 1C, which are simplified pictorial illustrations taken from various perspectives, showing part of a semiconductor wafer processing machine constructed and operative in accordance with a preferred embodiment of the present invention and to FIGS. 2A, 2B and 2C, which are simplified pictorial illustrations of a moveable stage assembly forming part of the semiconductor wafer processing machine of FIGS. 1A-1C and showing flexible positive fluid pressure connections to a venturi sub-assembly forming a part thereof.

As seen in FIGS. 1A-2C, there is seen vacuum hold-down apparatus suitable for retaining a semiconductor wafer in a desired position and orientation, forming part of a semiconductor wafer processing machine 100 such as an Archer™ 600, commercially available from KLA-Tencor Corporation of Milpitas, Calif., USA. As seen particularly in FIGS. 1A-1C, a source of positive pressure, such as a positive pressure outlet provided in a manufacturing facility and coupled to an air compressor, is coupled via one or more positive pressure conduits 102 to a positive pressure controller 104, which includes inter alia a manually operable pressure cut-off switch. An additional one or more flexible positive pressure conduits 106 provide a supply of positive pressure from pressure controller 104 to a moveable stage assembly 110.

Moveable stage assembly 110 may be any suitable moveable stage assembly 110 which is arranged for selectable X and Y direction displacement of a rotating vacuum chuck assembly 120. Vacuum chuck assembly 120 is operative for selectable rotational positioning of a vacuum chuck surface defining element 130 having a vacuum communication aperture 132 at the center of a vacuum chuck surface 134.

Figure 3A:
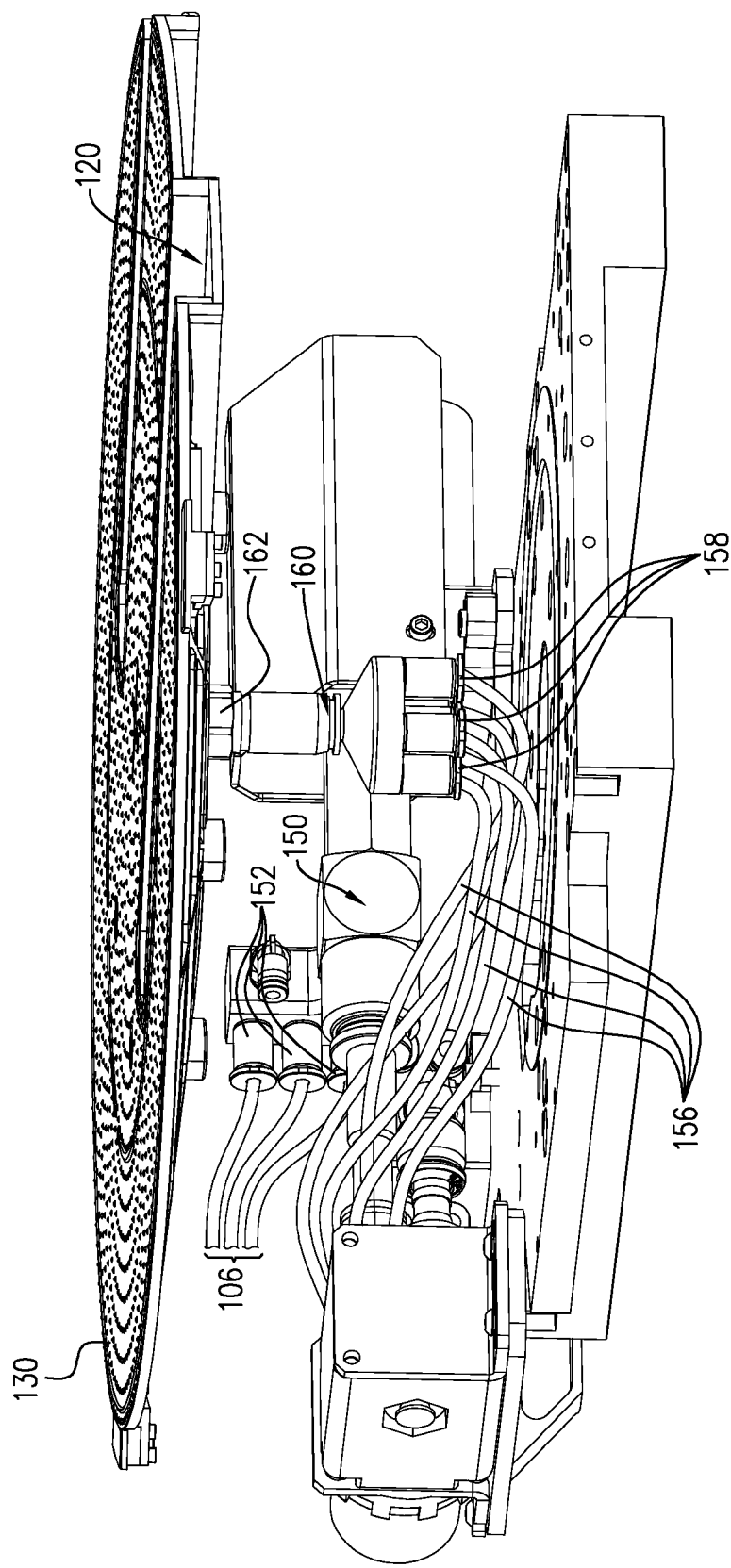
FIGS. 3A, 3B and 3C are simplified respective pictorial assembled, pictorial partially exploded and sectional view illustrations showing vacuum connections between the venturi sub-assembly of FIGS. 2A-2C and a central vacuum manifold and conduit assembly, which is coupled to an aperture in a vacuum hold-down surface of the movable stage assembly of FIGS. 2A-2C.
Figure 3B:
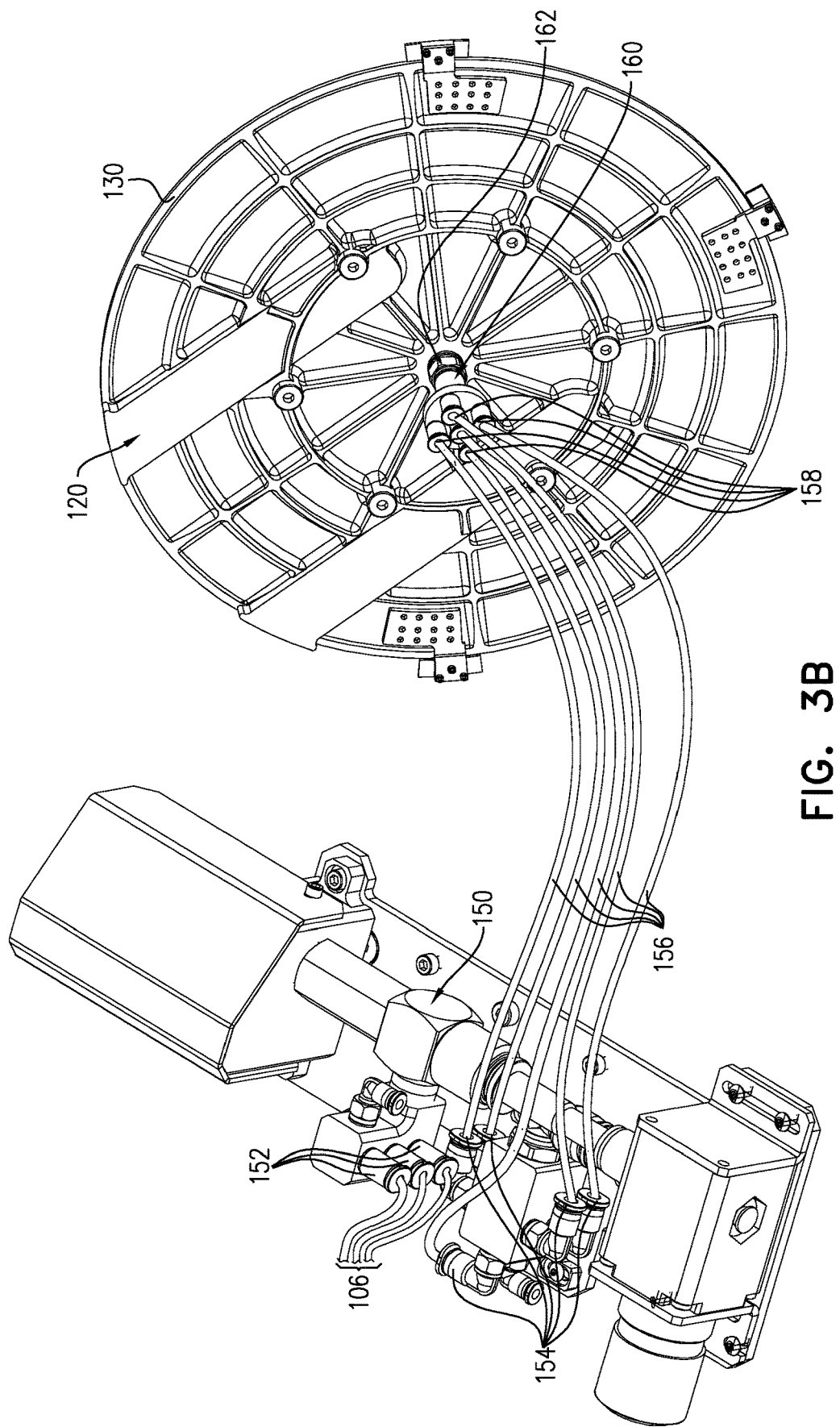
Figure 3C:
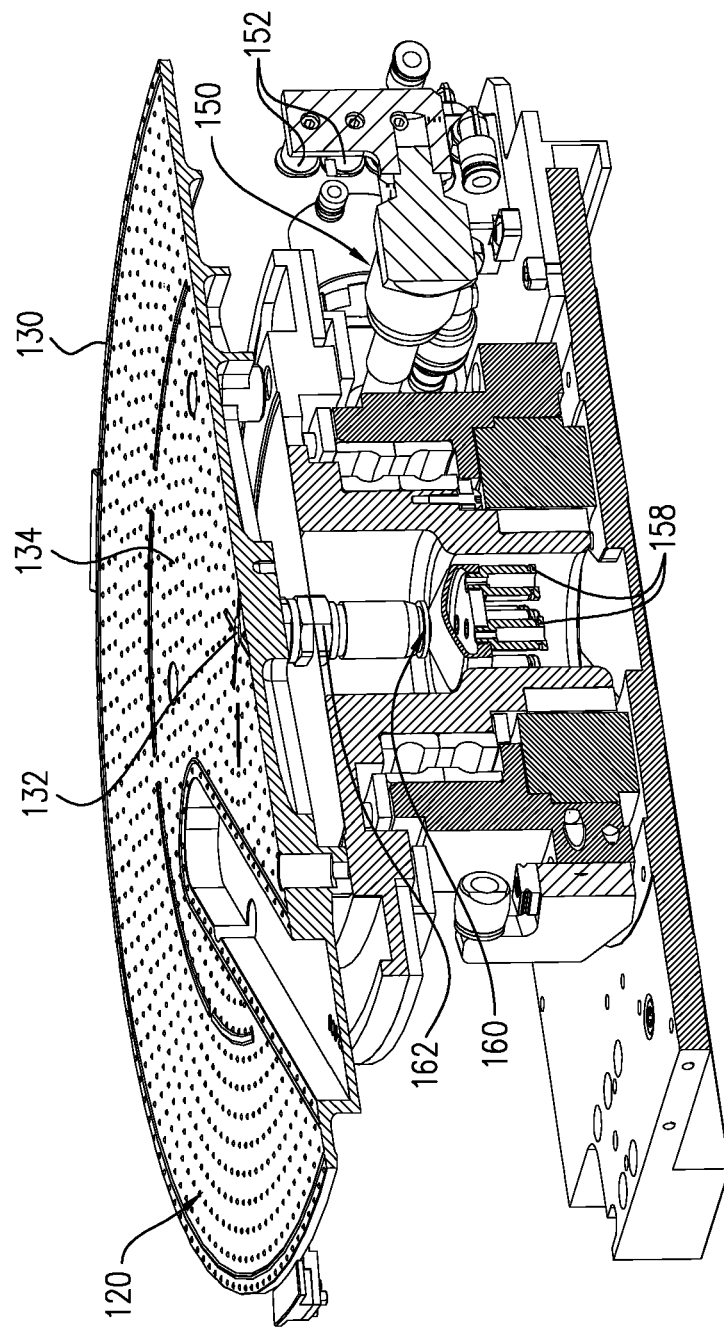

As seen in FIGS. 3A-3C, it is a particular feature of an embodiment of the present invention that a venturi vacuum generator 150 is fixed with respect to vacuum chuck assembly 120 for providing vacuum to vacuum chuck surface defining element 130. Venturi vacuum generator 150 receives a positive pressure fluid flow, typically a flow of air under pressure of 8 bar via flexible positive pressure conduits 106. Venturi generator 150 is preferably a VRL100-100202, commercially available from Nihon Pisco Co., Ltd. of Okaya, Nagano, Japan, and includes at least one positive pressure input connector port 152 and at least one vacuum port 154.

Venturi vacuum generator 150 preferably communicates with vacuum chuck surface defining element 130 via a plurality of vacuum ports 154 and a plurality of vacuum conduits 156, which are connected to a plurality of corresponding vacuum input ports 158 of a central vacuum manifold and conduit assembly 160 having a rotatable vacuum connection 162 to vacuum chuck surface defining element 130 at vacuum communication aperture 132.

It is appreciated that since Venturi vacuum generator 151) is in close proximity to vacuum chuck surface 134, the extent of vacuum conduits 156 is shortened, and vacuum losses are thereby minimized.

Figure 4B:
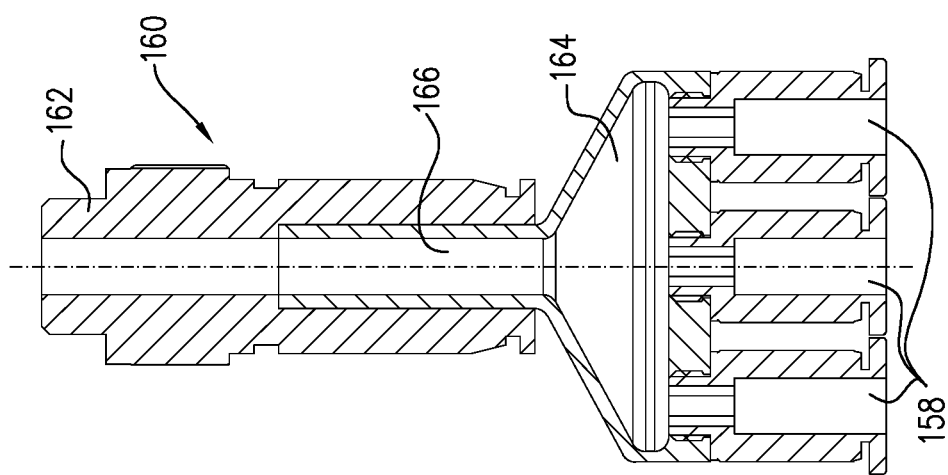
FIGS. 4A and 4B are respective exploded view and sectional illustrations of the central vacuum manifold and conduit assembly of FIGS. 3A-3C.
Figure 4A:
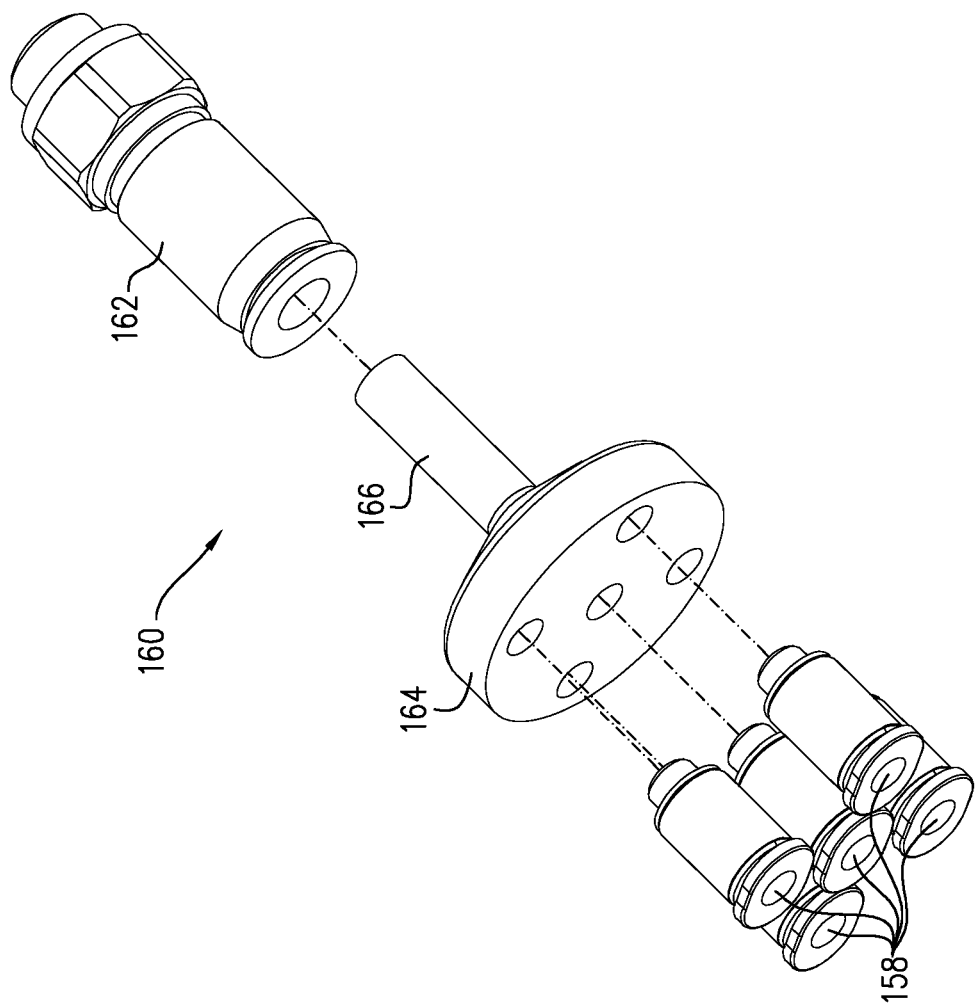

Turning now additionally to FIGS. 4A and 4B, central vacuum manifold and conduit assembly 160 also preferably includes a manifold 164 which is connected to vacuum input ports 158 and includes a single vacuum output conduit portion 166, which is coupled to rotatable vacuum connection 162.

Figure 5A:
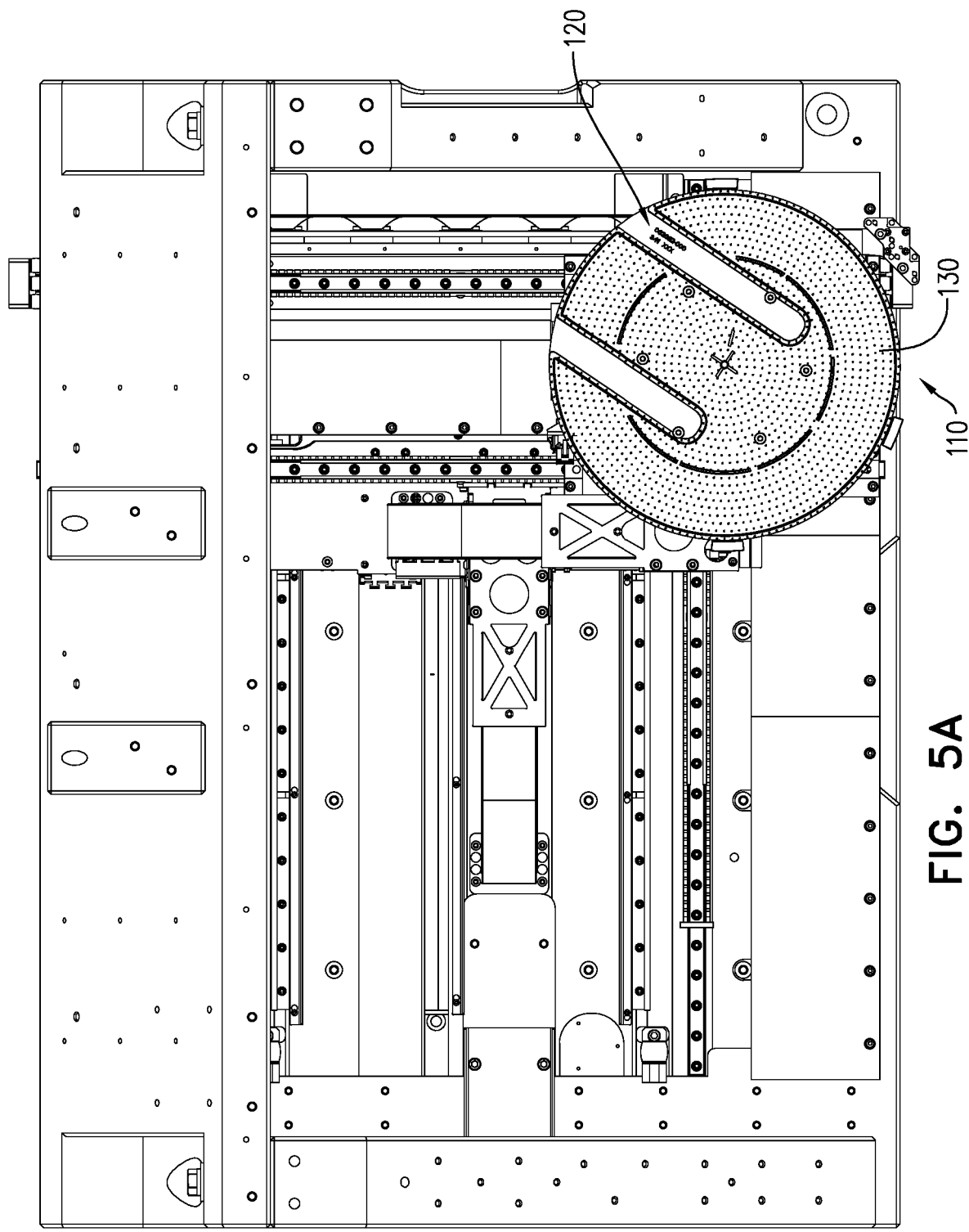
FIGS. 5A, 5B and 5C are simplified top view illustrations of the movable stage assembly of FIGS. 3A-4B in three different typical operative orientations.
Figure 5B:
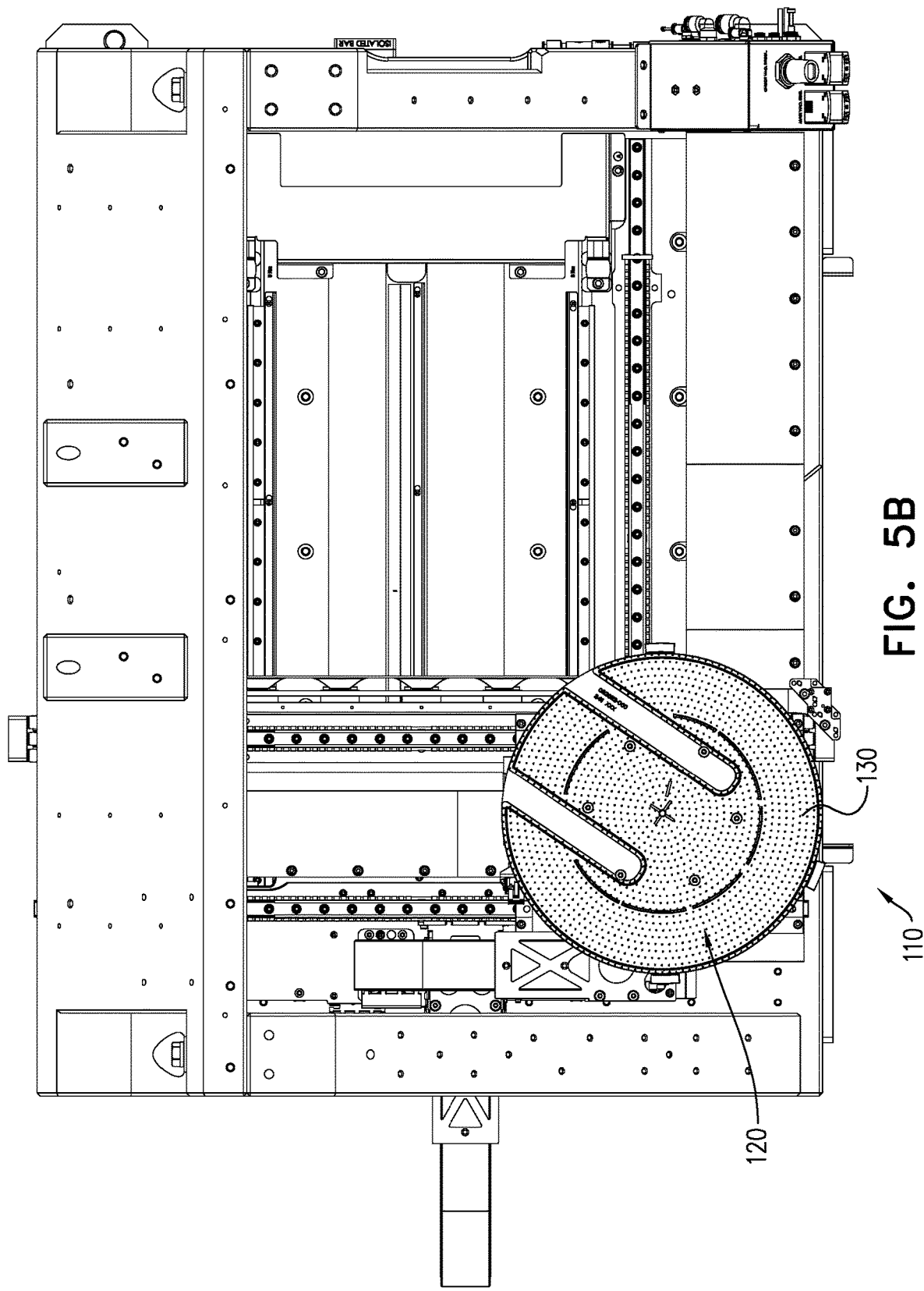
Figure 5C:
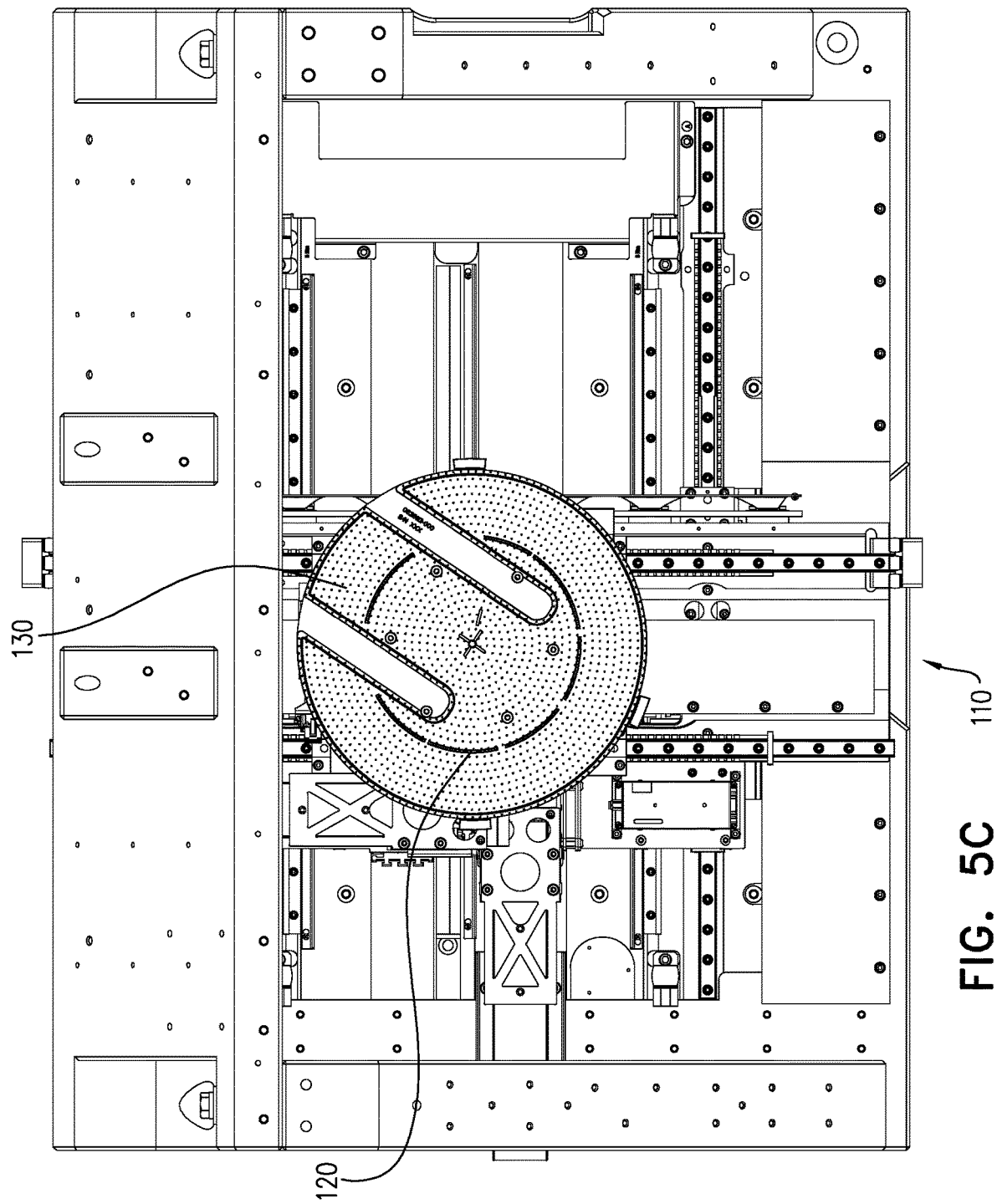

Referring now additionally to FIGS. 5A-5C, it is seen that vacuum chuck surface defining element 130 may have various positions in an X-Y plane and various rotational orientations relative to vacuum chuck assembly 120.

Figure 6:
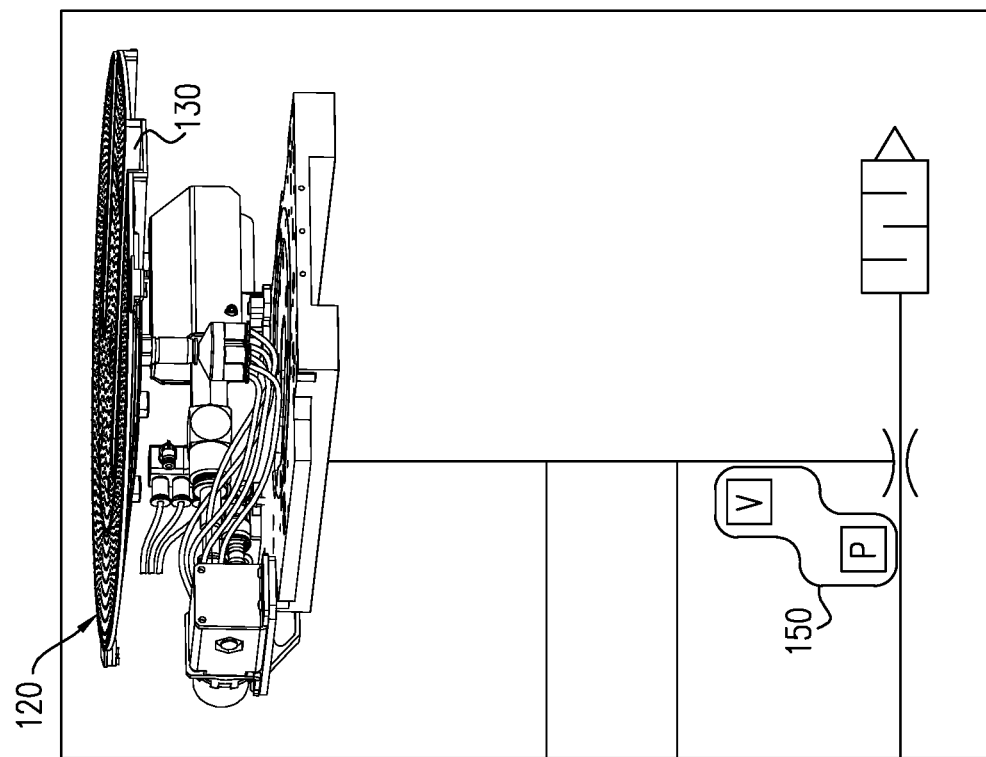
FIG. 6 is a simplified schematic illustration of an additional embodiment of the semiconductor wafer processing machine of FIGS. 1A-5C.
Figure 6:
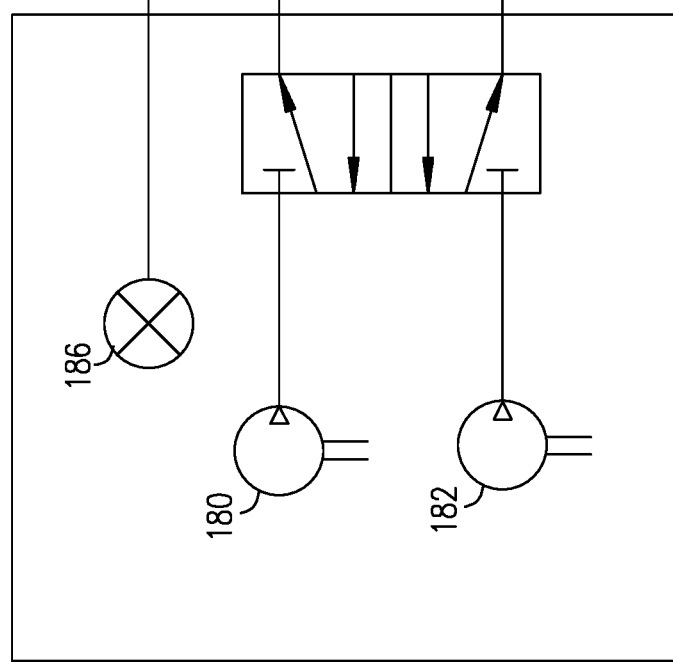

As seen in FIG. 6, in an additional embodiment of the present invention vacuum chuck assembly 120 is connected both to Venturi vacuum generator 150 and to an additional vacuum source 180. Venturi vacuum generator 150 is coupled to a source of positive pressure 182, such as a positive pressure outlet provided in a manufacturing facility. Additional vacuum source 180 is a source of vacuum other than Venturi vacuum generator 150, such as a vacuum outlet provided in a manufacturing facility.

Vacuum is selectively provided to vacuum chuck surface defining element 130. Vacuum is initially provided to vacuum chuck surface defining element 130 by Venturi vacuum generator 150, and when a vacuum sensor 186 provides an indication that sufficient vacuum has been established at vacuum chuck surface defining element 130, additional vacuum source 180 provides vacuum to vacuum chuck surface defining element 130 and Venturi vacuum generator 150 is switched off.

It is appreciated that in the additional embodiment shown in FIG. 6, central vacuum manifold and conduit assembly 160 includes additional vacuum input ports 158 to accommodate additional flexible vacuum connectors communicating between additional vacuum source 180 and vacuum communication aperture 132. Similarly, in the additional embodiment shown in FIG. 6, semiconductor wafer processing machine 100 includes a plurality of additional fittings and pipes necessary for the full functioning of additional vacuum source 180.

It will be appreciated by persons skilled in the art that the present invention is not limited to what has been particularly shown and described hereinabove. Rather the present invention includes combinations and sub-combinations of various features described hereinabove as well as modifications and variations thereof which are not in the prior art.

The invention claimed is:

1. A vacuum hold-down apparatus suitable for retaining a wafer in a desired position and orientation, the apparatus comprising:
   i. a vacuum chuck assembly defining a vacuum chuck surface having a vacuum communication aperture that extends to the vacuum chuck surface, wherein the vacuum chuck surface is configured to contact said wafer;
   ii. a venturi vacuum generator fixed with respect to said vacuum chuck assembly and communicating with said vacuum chuck surface via said vacuum communication aperture; and
   iii. a positive pressure fluid line communicating with said venturi vacuum generator.

2. The vacuum hold-down apparatus according to claim 1 and wherein said vacuum chuck assembly and said venturi vacuum generator are both mounted on a movable stage.

3. The vacuum hold-down apparatus according to claim 2 and wherein said positive pressure fluid line is a flexible fluid line.

4. The vacuum hold-down apparatus according to claim 3 and also comprising a fixed positive pressure fluid source which is coupled via said positive pressure fluid line to said venturi vacuum generator mounted on said movable stage.

5. The vacuum hold-down apparatus according to claim 1 and wherein said vacuum chuck surface is rotatable relative to said vacuum chuck assembly.

6. The vacuum hold-down apparatus according to claim 1 and wherein said movable stage is an X-Y movable stage.

7. The vacuum hold-down apparatus according to claim 1 and wherein said vacuum chuck assembly includes a vacuum chuck surface defining element which is rotatable relative to said venturi vacuum generator.

8. The vacuum hold-down apparatus according to claim 7 and wherein said venturi vacuum generator is coupled to said vacuum chuck surface of said vacuum chuck surface defining element via a central vacuum manifold and conduit assembly having a rotatable vacuum connection to said vacuum chuck surface defining element.

9. The vacuum hold-down apparatus according to claim 8 and wherein said venturi vacuum generator is coupled to said vacuum chuck surface of said vacuum chuck surface defining element via a plurality of vacuum ports and a plurality of vacuum conduits, which are connected to a plurality of corresponding vacuum input ports of said central vacuum manifold and conduit assembly.

10. The vacuum hold-down apparatus according to claim 9 and wherein said central vacuum manifold and conduit assembly comprises a manifold, which is connected to said vacuum input ports and includes a single vacuum output conduit portion, which is coupled to said rotatable vacuum connection.

11. The vacuum hold-down apparatus according to claim 2 and wherein said vacuum chuck surface is rotatable relative to said vacuum chuck assembly.

12. The vacuum hold-down apparatus according to claim 2 and wherein said movable stage is an X-Y movable stage.

13. The vacuum hold-down apparatus according to claim 2 and wherein said vacuum chuck assembly includes a vacuum chuck surface defining element which is rotatable relative to said venturi vacuum generator.

14. The vacuum hold-down apparatus according to claim 13 and wherein said venturi vacuum generator is coupled to said vacuum chuck surface of said vacuum chuck surface defining element via a central vacuum manifold and conduit assembly having a rotatable vacuum connection to said vacuum chuck surface defining element.

15. The vacuum hold-down apparatus according to claim 14 and wherein said venturi vacuum generator is coupled to said vacuum chuck surface of said vacuum chuck surface defining element via a plurality of vacuum ports and a plurality of vacuum conduits, which are connected to a plurality of corresponding vacuum input ports of said central vacuum manifold and conduit assembly.

16. The vacuum hold-down apparatus according to claim 15 and wherein said central vacuum manifold and conduit assembly comprises a manifold, which is connected to said vacuum input ports and includes a single vacuum output conduit portion, which is coupled to said rotatable vacuum connection.

17. The vacuum hold-down apparatus according to claim 1 and also comprising an additional vacuum connection communicating with said vacuum chuck surface via said vacuum communication aperture.

18. The vacuum hold-down apparatus according to claim 17 and wherein said vacuum hold-down apparatus is operative to selectively supply vacuum to said vacuum chuck assembly from either said venturi vacuum generator or from said additional vacuum connection.

19. The vacuum hold-down apparatus according to claim 2 and also comprising an additional vacuum generator communicating with said vacuum chuck surface via said vacuum communication aperture and wherein said additional vacuum generator is mounted on said movable stage.

20. The vacuum hold-down apparatus according to claim 19 and wherein said vacuum hold-down apparatus is operative to selectively supply vacuum to said vacuum chuck assembly from either said venturi vacuum generator or from said additional vacuum generator.

* * * * *